United States Patent [19]

Yamamoto et al.

[11] Patent Number: 4,672,148

[45] Date of Patent: Jun. 9, 1987

[54] THIN-FILM SOLAR CELLS

[75] Inventors: Yoshihiro Yamamoto, Nara; Masaya Hijikigawa, Yamato-Koriyama, both of Japan

[73] Assignee: Sharp Kabushiki Kaisha, Osaka, Japan

[21] Appl. No.: 796,940

[22] Filed: Nov. 12, 1985

[30] Foreign Application Priority Data

Dec. 5, 1984 [JP] Japan .................................. 59-258119

[51] Int. Cl.$^4$ ............................................. H01L 31/06
[52] U.S. Cl. ....................................... 136/258; 357/30; 357/59
[58] Field of Search ................. 136/258 PC, 258 AM; 357/30, 59 C

[56] References Cited

FOREIGN PATENT DOCUMENTS 58-122786  7/1983  Japan .................................. 136/258

OTHER PUBLICATIONS

P. H. Fang et al., *Appl. Phys. Lett.*, vol. 41, pp. 365–366 (1982).

*Primary Examiner*—Aaron Weisstuch
*Attorney, Agent, or Firm*—Flehr, Hohbach, Test, Albritton & Herbert

[57] ABSTRACT

A thin-film solar cell with improved photoelectric conversion efficiency has an active region for photoelectric conversion including a doped layer formed in a laminated structure with a non-crystal layer and a layer of microcrystal mixtures.

3 Claims, 4 Drawing Figures

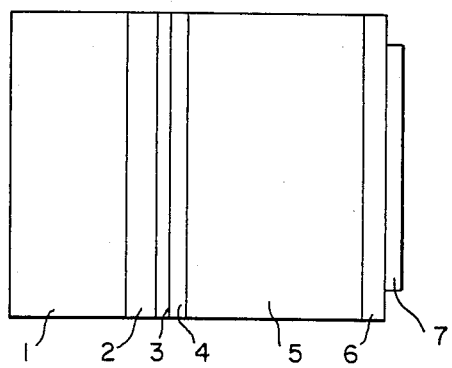
FIG.—1
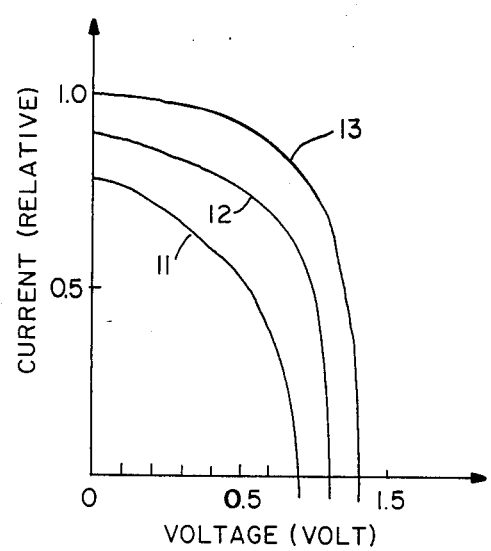
FIG.—2
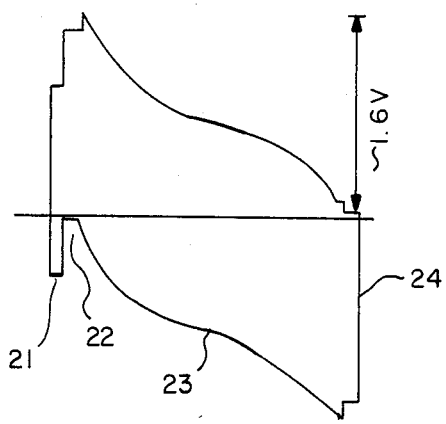
FIG.—3a
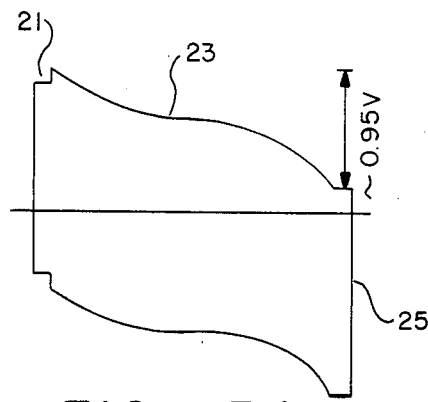
FIG.—3b

THIN-FILM SOLAR CELLS

This invention relates to an improved thin-film solar cell with a non-crystal layer and a layer of microcrystal mixtures and in particular to such a thin-film solar cell with improved photoelectric conversion efficiency.

Thin-film solar cells using non-crystal silicon, etc. are actively being developed in recent years and improvement of their photoelectric conversion efficiency has come to be considered an important research subject. Conventional methods of improving the photoelectric conversion efficiency of a thin-film solar cell include the use of non-crystal semiconductor materials (such as a-$Si_xC_{1-x}$:H) with a wide forbidden band in doped layers in order to reduce light loss in the doped layer on the incident side or a layer of microcrystal mixtures with a small coefficient of light absorption in the visible range. When a transparent substrate such as a glass substrate is used, however, light may enter through the side surfaces of the substrate, and it is now customary to form a transparent, electrically conductive layer over a glass substrate and a silicon hydride layer thereon in the order of p-i-n or n-i-p ("i" indicating no doping or very little doping) with a back electrode provided on the reverse side. When the layers are formed in the order of p-i-n, in particular, the loss of short-wavelength light becomes greater in this part because the commonly used p-type silicon hydride layers have a large coefficient of light absorption. For this reason, use is generally made of an a-Si:C:H film with a wide forbidden band as the p-layer in order to reduce the light loss and hence to improve the overall conversion efficiency of the solar cell.

By using a layer of microcrystal mixtures for a solar cell, one may anticipate improved characteristics because not only the light loss in the doped layer on the incident side can be reduced as in the case of a p-type a-Si:C:H layer, but also the internal voltage of the solar cell can be significantly increased and there will be no problem of contaminating the i-layer to be formed next since there are no foreign elements contained as in the case of a-Si:C:H.

When a layer of microcrystal mixtures is formed by a chemical vapor deposition method, however, the raw material gas is usually diluted with hydrogen gas and high radio frequency power is applied. When the formation takes place on the transparent and electrically conductive layer, however, the characteristics of the resultant solar cell are not always improved because reducing reactions take place near the surface and adversely affect its light transmissivity, and the constituent elements of the transparent layer become mixed into the silicon hydride layer to an excessive degree.

It is therefore an object of the present invention in view of the above to provide a thin-film solar cell with improved photoelectric conversion characteristics.

It is another object of the present invention to provide a thin-film solar cell with the characteristics of its transparent layer, etc. not affected adversely.

It is a further object of the present invention to provide a thin-film solar cell which fully utilizes advantageous characteristics of its layer of microcrystal mixtures.

The above and other objects of the present invention are attained by providing a thin-film solar cell comprising active regions for photoelectric conversion containing a doped layer of a laminated structure with a non-crystal layer and a layer of microcrystal mixtures. With a structure like this, the characteristics of the transparent and electrically conductive layer, etc. are not affected adversely and those of the layers of the microcrystal mixtures can be fully utilized.

The accompanying drawings, which are incorporated into and form a part of the specification, illustrate an embodiment of the present invention and, together with the description, serve to explain the principles of the invention. In the drawings:

FIG. 1 is a cross-sectional side view showing the structure of a thin-film solar cell according to an embodiment of the present invention, FIG. 2 is a graph showing the current-voltage characteristics of solar cells including one embodying the present invention, and FIGS. 3a and 3b show energy band structures of solar cells.

In FIG. 1 which shows the cross-sectional structure of a thin-film solar cell according to one embodiment of the present invention, numeral 1 indicates a transparent glass substrate, numeral 2 indicates a transparent and electrically conductive layer, numeral 3 indicates a p-type non-crystal silicon hydride layer of thickness 20-100Å, numeral 4 indicates a silicon hydride layer of p-type microcrystal mixtures of thickness 40-200Å, numeral 5 indicates an i-type silicon hydride layer, numeral 6 indicates an n-type silicon hydride layer and numeral 7 indicates a back electrode. They are formed one on top of another in the given order as shown in FIG. 1 such that a p-type layer which represents the doped layer in the region of photoelectric conversion is formed in a laminated structure with the non-crystal layer 3 and the layer of microcrystal mixtures 4 and that the non-crystal layer 3 is directly in contact with the transparent and electrically conductive layer 2. Although the active region for photoelectric conversion in the above embodiment may be formed in a p-i-n structure by a glow discharge decomposition method, it may be formed instead in the order of n-i-p, with the n-type layer having a laminated structure with a non-crystal layer and a layer of microcrystal mixtures.

Next, the electrical characteristics of thin-film solar cells including one embodying the present invention are described by way of FIG. 2 which shows their current-voltage characteristics when irradiated by light. For the purpose of FIG. 2, different thin-film silicon solar cells were produced by plasma chemical vapor deposition with the general structure of glass—transparent conductor—p-i-n active region for photoelectric conversion - back electrode. Curve 11 of FIG. 2 represents the characteristics of such a thin-film solar cell with its p-layer entirely made of a layer of microcrystal mixtures, Curve 12 is for another cell with its p-layer entirely made of a non-crystal layer, and Curve 13 is for a cell according to the present invention with its p-layer having the laminated structure of FIG. 1. FIG. 2 clearly shows that the characteristics of the cell according to the present invention (Curve 13) are improved. The value of its current under the short circuit condition is greater than those of the comparison cells and its voltage value under the open circuit condition is also improved. FIG. 2 also makes it clear that the cell with only microcrystal mixtures (Curve 11) shows inferior characteristics as compared to the cell with only a non-crystal layer (Curve 12). The favorable characteristics associated with a layer of microcrystal mixtures can be effectively utilized according to the present invention by structuring the p-layer (or the n-layer) on the side of the glass substrate in a laminated form.

FIG. 3 shows the energy band structure of solar cells. FIG. 3a relates to a cell wherein a layer of microcrystal mixtures is used as the doped layer in the active region of photoelectric conversion (the p-layer being of a laminated structure with a non-crystal layer). FIG. 3b relates to a cell wherein a non-crystal layer is used as the doped layer.

In FIGS. 3a and 3b, numeral 21 indicates a layer of p-type non-crystal silicon hydride, numeral 22 indicates a layer of p-type microcrystal mixtures, numeral 23 indicates a silicon hydride layer with no or little doping (i-type), numeral 24 is a silicon hydride layer of n-type microcrystal mixtures and numeral 25 indicates an n-type non-crystal silicon hydride layer. When a doped layer of microcrystal mixtures is used, the internal voltage of the solar cell increases significantly as shown in FIG. 3a and it may be concluded that there is reduction in the recombination rate of carriers in the i-layer and the current-voltage characteristics show improvements if a thin-film solar cell is constructed according to the present invention as described above.

In summary, a thin-film solar cell according to the present invention has no adverse effects on the characteristics of the transparent and electrically conductive layer, etc. but takes full advantage of the properties of a layer of microcrystal mixtures. With a doped layer on the transparent and electrically conductive layer structured in a laminated form with a non-crystal layer and a layer of microcrystal mixtures, the thin-film solar cell of the present invention has significantly improved photoelectric conversion characteristics.

The foregoing description of a preferred embodiment of the invention has been presented for purposes of illustration and description. It is not intended to be exhaustive or to limit the invention to the precise form disclosed, and obviously many modifications and variations are possible in light of the above teaching. Such minor changes and modifications which may be apparent to a person skilled in the art are intended be included within the scope of this invention.

What is claimed is:

1. A thin-film solar cell comprising an active region for photoelectric conversion including a doped layer, said doped layer being of a laminated structure with a non-crystal layer and a layer of microcrystal mixtures, said active region further including a silicon hydride layer of p-i-n structure formed by glow discharge decomposition and at least one of the p-type or the n-type layer of said silicon hydride layer comprising a laminated structure of a non-crystal layer and a layer of microcrystal mixtures, said silicon hydride layer of p-i-n structure being formed on a transparent and electrically conductive layer formed on a glass substrate, and said non-crystal layer of said doped layer being directly in contact with said transparent and electrically conductive layer.

2. The solar cell of claim 1 wherein said p-type non-crystal silicon hydride layer has a thickness 20-100A.

3. The solar cell of claim 1 wherein said layer of p-type microcrystal mixtures has a thickness 40-200A.

* * * * *